United States Patent [19]

Jackson et al.

[11] Patent Number: 5,039,653

[45] Date of Patent: Aug. 13, 1991

[54] GROWTH OF SUPERCONDUCTOR MATERIAL IN A FLUXED MELT, AND ARTICLE OF MANUFACTURE

[75] Inventors: Kenneth A. Jackson, New York, N.Y.; Lynn F. Schneemeyer, Westfield, N.J.

[73] Assignee: AT&T Bell Laboratories, Murray Hill, N.J.

[21] Appl. No.: 503,062

[22] Filed: Mar. 29, 1990

Related U.S. Application Data

[63] Continuation of Ser. No. 170,530, Mar. 22, 1988, abandoned.

[51] Int. Cl.$^5$ ............................................. C30B 7/08
[52] U.S. Cl. ........................................ 505/1; 505/729; 156/621; 156/623 R
[58] Field of Search ............... 156/621, 623 R, 623 Q; 505/1, 729, 783, 782

[56] References Cited

U.S. PATENT DOCUMENTS

| | | | |
|---|---|---|---|
| 4,685,995 | 8/1987 | Hirano | 156/623 R |
| 4,746,396 | 5/1988 | Marner | 156/621 |

FOREIGN PATENT DOCUMENTS 0199440  10/1986  European Pat. Off. ............. 156/621

OTHER PUBLICATIONS

Katsui, "Single Crystal Growth of Superconducting $BaPbBiO_3$ from $PbO_2-Bi_2O_3-BaPbO_3$ Solution", Japanese Journal of Applied Physics, vol. 21, No. 9, Sep. 1982, pp. L553-L554.
Ginsberg et al, "Two Types of Measurements on Single Crystal YBaCuO . . . ", Extended Abstracts, High Tc Superconductors (II), Apr. 5-9, 1988, Symposium Support M.R.S., pp. 217-220.
Schneemeyer et al. (I) "Superconductivity in YBaCuO Single Crystals", Nature, vol. 328, Aug. 13, 1987, pp. 601-603.
Schneemeyer et al. (II), "Growth of Superconducting Crystals in the Bi-Sr-Ca-Cu-O . . . ", Nature, vol. 332, Mar. 31, 1988, pp. 422-424.
Dover et al., "Critical Current Densities in Single Crystal BiSrCaCuO", Applied Physics Letters, 52(22) May 30, 1988, pp. 1910-1912.
Holland et al, "Interplay of Synthesis, Structure, Microstructure and Properties", Chemistry of High Temperature Superconductors, American Chemical Society, 1987, pp. 102-113.
Katsui et al. '88, "Solution Growth of Bi-Sr-Ca-Cu-O Compounds Using Alkali Chlorides", Journal of Crystal Growth, 91 (1988), pp. 261-263.
"A New High-Temperature Superconductor: $Bi_2Sr_{3-x}Ca_xCu_2O_{8+y}$", Science, vol. 239, pp. 1015-1017, by M. A. Subramanian et al.

*Primary Examiner*—Robert Kunemund
*Attorney, Agent, or Firm*—E. E. Pacher

[57] ABSTRACT

A bismuth-strontium calcium cuprate material shows commercial promise as a high-$T_c$ superconductor material, means are desired for producing such (as well as isostructural) superconductor material in the form of macroscopic single-crystal bodies. The invention provides for the growth of such bodies from a fluxed melt, in bulk or epitaxially on a substrate, the fluxing agent being chosen to include sodium chloride, potassium chloride, or a mixture of sodium chloride and potassium chloride.

10 Claims, 1 Drawing Sheet

U.S. Patent
Aug. 13, 1991
5,039,653
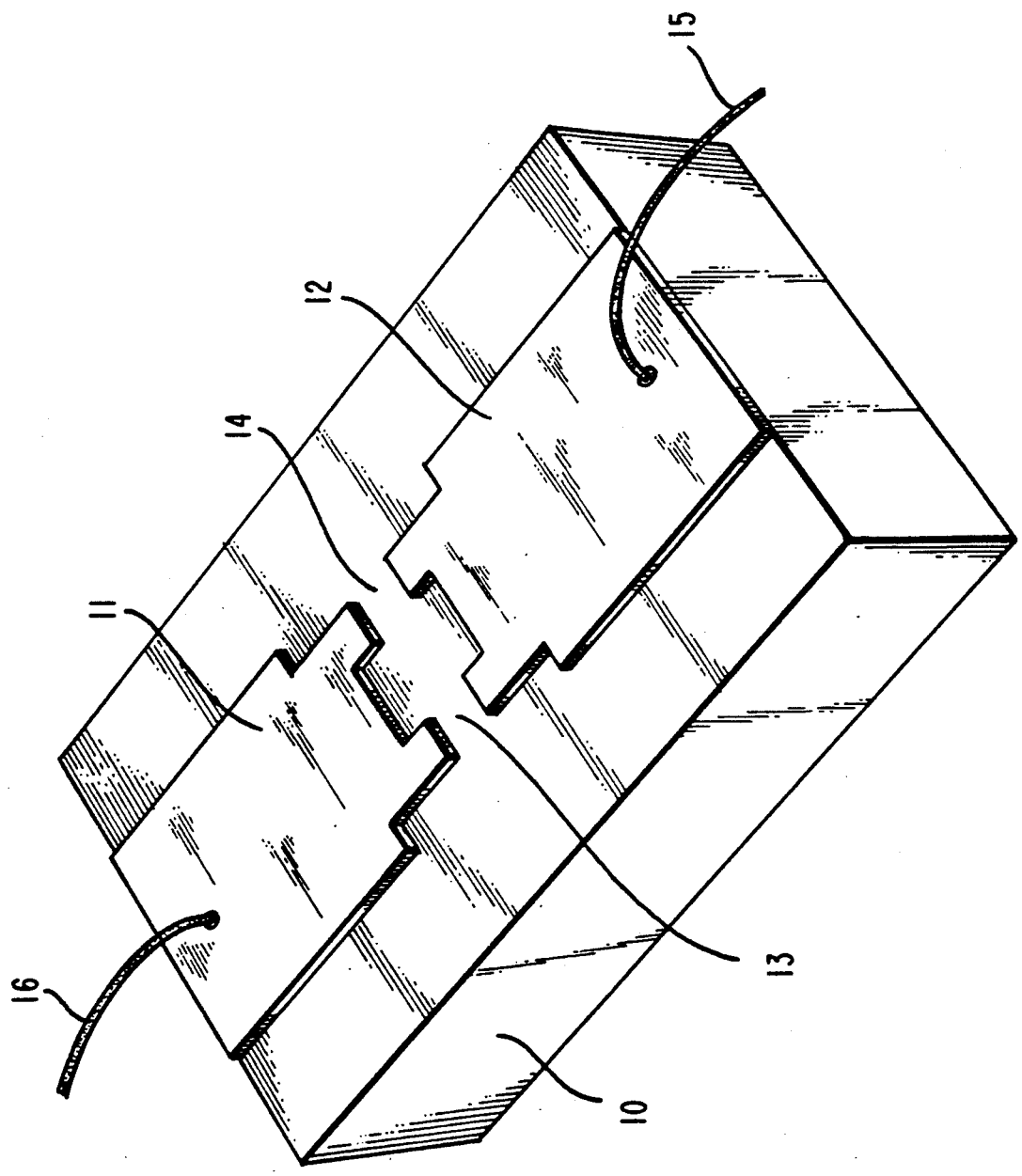

GROWTH OF SUPERCONDUCTOR MATERIAL IN A FLUXED MELT, AND ARTICLE OF MANUFACTURE

This application is a continuation of application Ser. No. 170,530, filed on Mar. 22, 1988, now abandoned.

TECHNICAL FIELD

The invention is concerned with articles including a superconductor material, and with the manufacture of such materials and articles.

BACKGROUND OF THE INVENTION

On account of superconductor characteristics at temperatures of boiling nitrogen (77 K) and above, materials having one of two recently discovered compound structures show significant and potentially revolutionizing technological promise. Among representatives of the first such structures are compounds in the La-Ba-Cu-O and Y-Ba-Cu-O systems; representative of the second are bismuth-strontium calcium cuprates having representative composition $Bi_{2.2}Sr_2Ca_{0.8}Cu_2O_{8+\delta}$, with $\delta$ in the vicinity of 0.2. In this respect see also, e.g., the paper by M. A. Subramanian et al., "A New High-Temperature Superconductor: $Bi_2Sr_{3-x}Ca_xCu_2O_{8+y}$", *Science*, Vol. 239, pp. 1015-1017 (1988).

While many properties of these materials can be studied in sintered polycrystalline samples, it is desirable to provide single crystals of macroscopic dimensions, e.g., for the purpose of determining correlations between structural parameters and superconductor properties. Also, as contemplated superconductor applications include the use of thin, possibly patterned superconductor layers having significant current-carrying capability, and as such capability is likely to be highest in single-crystal material, there is strong interest in epitaxially deposited single-crystal layers, e.g., in switching and logic device technology.

SUMMARY OF THE INVENTION

The invention provides for the growth (deposition, precipitation) of bismuth-strontium calcium cuprate superconductor material and of other, isostructural superconductor materials such as lead-substituted bismuth-strontium calcium cuprate and thallium-barium calcium cuprate superconductor materials. Preferred growth is in a fluxed melt comprising crystal constituents as solutes, in combination with a flux component which acts as solvent; preferred flux constituents are alkali chlorides such as sodium chloride and potassium chloride. Further preferred is the growth of macroscopic bodies of essentially single-crystal material, such bodies having a preferred diameter which is greater than 2 mm, or which even may equal 3 mm or more. Included in this class of bodies are epitaxially deposited layers. (Essentially single-crystal material may deviate from ideal crystal structure due to irregularities such as stacking faults, for example; such faults are considered as having no significant influence on superconductor transition temperature.)

BRIEF DESCRIPTION OF THE DRAWING

The FIGURE is a schematic representation of a superconductor quantum interference detector (SQUID), greatly enlarged for the sake of clarity, representing a preferred embodiment of a device in accordance with the invention.

DETAILED DESCRIPTION

The FIGURE shows substrate 10, first and second respective superconductor layers 11 and 12 separated by gaps 13 and 14 (typical gap widths being on the order of 1 micrometer), and electrical connections 15 and 16. (For further details with respect to the design and functioning of SQUID devices see, e.g., B. B. Schwartz et al., *Superconductor Application: SQUIDS and Machines*, Plenum Press, New York, 1977.)

In accordance with the depicted embodiment of the invention, layers 11 and 12 consist essentially of epitaxially deposited bismuth-strontium calcium cuprate superconductor material and, with respect to the device shown in the Figure, preferred processing in accordance with the invention provides for epitaxial growth of layers 11 and 12 in a fluxed melt on a suitable substrate such as, e.g., a strontium titanate substrate.

Other than to bismuth-strontium calcium cuprate superconductor material, crystal growth in accordance with the invention is applicable to thallium-barium calcium cuprate superconductor material having representative composition $Tl_2Ba_2CaCu_2O_{8+\delta}$, and to lead-substituted bismuth-strontium calcium cuprate superconductor material having representative composition $Bi_{2.2-x}Pb_xSr_2Ca_{0.8}Cu_2O_{8+\delta}$, all being isostructural to bismuth-strontium calcium cuprate superconductor material.

Crystal growth in accordance with the invention may be initiated by spontaneous nucleation in a body of molten material; alternatively, growth may be on a seed or substrate. Substrate material is chosen for chemical compatibility with material to be deposited and, in the case of preferred, essentially single-crystal growth, seed or substrate material is chosen crystallographically compatible with material to be grown. Quite generally, whether growth produces single-crystal or polycrystalline material, and whether growth is epitaxial, by pulling from a melt, or by directional cooling, growth involves cooling so as to produce supersaturation or undercooling of the melt with respect to the solute to be precipitated, such supersaturation being at least in the vicinity of a surface or in region where precipitation is desired. In many instances, desired growth conditions result from gradual cooling of a melt over-all; alternatively, with melt temperature held constant on average, a temperature gradient can be produced, e.g., as a somewhat colder substrate is dipped into a melt.

While, for the preparation of a melt, use of a platinum crucible may be optimal, ceramic crucibles such as, e.g., high-purity alumina crucibles can also be used. A desired melt or body of molten material can be produced by conventional mixing of oxide ingredients, followed by melting at a temperature typically lying in a preferred range from 750° C. to 900° C. Preferred crystal growth temperatures are in a range from 650° C. to 800° C.

Preferred melts comprise a solute component representing 10 to 50 weight percent of the melt, a preferred amount of at least 50 weight percent of the remainder being sodium chloride, potassium chloride, or a mixture of sodium chloride and potassium chloride. A complementary portion of at most 50 weight percent of the remainder may include other alkali halides such as, e.g., rubidium chloride, and small amounts of other chlorides and fluorides.

The composition of deposited layers is relatively insensitive to the constitution of the solute component of a melt, with the relative amount of bismuth being somewhat sensitive, however, in that growth from a severely bismuth-deficient melt tends to favor a semiconductor phase over the desired super conductor phase. Considered as favorable is excess oxygen as introduced, e.g., by adding sodium oxide to a melt based on a sodium chloride flux—such addition having been found to favor regular growth of crystals from the melt. And, finally, care is indicated in preventing undue loss of bismuth by evaporation from the melt.

In device manufacture in accordance with the invention, crystal growth may be used in conjunction with other processing steps such as, e.g., the manufacture of substrates, the deposition of semiconductor layers, and the patterning of semiconductor as well as of superconductor layers by selective removal of deposited layer material. Available, for patterning, are a variety of methods including ion milling, as well as photolithographic methods as involving pattern generation and development in a sensitive layer, followed by pattern transfer by chemical means.

EXAMPLE 1

Commercially obtained oxide powders were mixed in the following approximate amounts: 3 g CuO, 2.7837 g $SrCO_3$, 1.3972 g $Ca(OH)_2$, and 4.3931 g $Bi_2O_3$. The mixture was placed in an oven at a temperature of approximately 700° C.; oven temperature was then raised to approximately 800° C. and held there for approximately 1 hour for prereaction of the mixture. After cooling, the resulting body was ground into a powder, and the powder was mixed with sodium chloride in a ratio of 1:4 by weight. The resulting mixture was placed in a platinum crucible and turned into a melt by heating to a temperature of approximately 850° C. After holding at this temperature for approximately 1 hour, the melt was allowed to cool to a temperature of approximately 760° C. at a rate of approximately 2° C. per hour, resulting in the formation of crystals in the form of platelets and bars at the surface of the melt. Platelets had a surface area greater than 1 $cm^2$, and bars were several millimeters long, with a width greater than 1 mm and a thickness of several micrometers. These crystals were separated mechanically from the solidified melt, and adherent salt remnants were removed from the crystals by washing in water. Other solvents suitable for washing include acetonitrile (methyl cyanide, $CH_3CN$).

Energy-dispersive spectroscopic analysis (EDS) showed no detectable levels of sodium or of chlorine in the crystals. Crystals were characterized by x-ray diffraction, and they were found to have an orthorhombic subcell with dimensions 5.414×5.418×30.89 Angstroms, and an incommensurable superlattice. Crystals were screened for superconductivity by monitoring their field-dependent microwave absorption near zero magnetic field. Onset of absorption was at a temperature of approximately 115K, and there was a sharp increase in absorption at a temperature of approximately 90K. At all temperatures, microwave absorption was anisotropic and greatest with the magnetic field in the direction of the crystallographic c-axis. Superconductivity was further confirmed by resistivity and susceptibility measurements. Zero resistance was achieved at a temperature of approximately 80K.

The effect of increasing the measuring current was studied over the range from 1 to 100 A/$cm^2$ (calculated on the basis of sample cross section); the transition temperature was found to shift by less than 1K over this range (as is indicative of high critical current density).

EXAMPLE 2

Crystal growth as described above in Example 1 was carried out with potassium chloride as flux material instead of sodium chloride. Grown crystals had essentially the same morphology and physical properties.

EXAMPLE 3

Crystal growth as described above in Example 1 was carried out with a 50—50 mole percent (eutectic) mixture of sodium-potassium chloride as flux material instead of sodium chloride alone. Grown crystals had essentially the same morphology and physical properties.

We claim:

1. A method for making a body of bismuth-strontium calcium cuprate, lead-substituted bismuth strontium calcium cuprate, or thallium-barium calcium cuprate superconductor material, said method comprising cooling a melt at least locally, said melt comprising constituents of said material, characterized in that said melts further comprises a flux component comprising at least one fluxing agent selected from the group consisting of sodium chloride and potassium chloride, such that the cuprate body has superconductor properties at a temperature of 77K.

2. The method of claim 1 in which said at least one fluxing agent constitutes an amount by weight of 50 percent or greater of the portion of said melt exclusive of said constituents.

3. The method of claim 1 in which said constituents represent 10 to 50 percent by weight of said melt.

4. The method of claim 1 in which said flux component comprises sodium chloride.

5. The method of claim 1 in which said flux component comprises potassium chloride.

6. The method of claim 1 in which said flux component comprises sodium chloride and potassium chloride.

7. The method of claim 1 in which cooling is to a temperature in the range from 650° C. to 800° C.

8. The method of claim 1 in which preparation of said melt comprises heating to a temperature in the range from 750° C. to 900° C.

9. The method of claim 1 in which remnant salt is removed from said body by washing.

10. The method of claim 9 in which washing is with water.

* * * * *